(12) United States Patent
Ichihara et al.

(10) Patent No.: US 6,727,718 B2
(45) Date of Patent: Apr. 27, 2004

(54) ELECTRONIC COMPONENT PACKAGE, PRINTED CIRCUIT BOARD, AND METHOD OF INSPECTING THE PRINTED CIRCUIT BOARD

(75) Inventors: Yasuhiro Ichihara, Kawasaki (JP); Seiji Kogure, Kawasaki (JP); Hiroshi Iimura, Kawasaki (JP); Fumio Arase, Kawasaki (JP)

(73) Assignee: Fujistu Limited, Kawasaki (JP)

( * ) Notice: Subject to any disclaimer, the term of this patent is extended or adjusted under 35 U.S.C. 154(b) by 0 days.

(21) Appl. No.: 10/298,640

(22) Filed: Nov. 19, 2002

(65) Prior Publication Data

US 2003/0063448 A1 Apr. 3, 2003

Related U.S. Application Data

(62) Division of application No. 09/124,509, filed on Jul. 29, 1998, now Pat. No. 6,498,307.

(30) Foreign Application Priority Data

Mar. 11, 1998 (JP) .............................. 10-59156

(51) Int. Cl.[7] .......................... G01R 31/26; H01L 21/66
(52) U.S. Cl. ........................ 324/755; 324/765; 438/17
(58) Field of Search ............................... 324/754, 755, 324/757, 765; 438/17; 174/260, 261, 255; 361/767–771; 257/730, 737, 738

(56) References Cited

U.S. PATENT DOCUMENTS

| | | | |
|---|---|---|---|
| 3,335,327 A | 8/1967 | Damon et al. | |
| 3,353,139 A | 11/1967 | Ribbelink | |
| 3,871,014 A | 3/1975 | King et al. | |
| 4,604,644 A | 8/1986 | Beckham et al. | |
| 5,381,307 A | 1/1995 | Hertz et al. | |
| 5,386,342 A | 1/1995 | Rostoker | |
| RE35,119 E | 12/1995 | Blonder et al. | |
| 5,539,153 A * | 7/1996 | Schwiebert et al. | 174/260 |
| 5,598,036 A * | 1/1997 | Ho | 257/738 |
| 5,748,450 A | 5/1998 | Kim et al. | |
| 5,770,891 A * | 6/1998 | Frankeny et al. | 257/727 |
| 5,847,936 A | 12/1998 | Forehand et al. | |
| 5,854,534 A * | 12/1998 | Beilin et al. | 257/691 |
| 5,901,046 A | 5/1999 | Ohta et al. | |
| 5,907,187 A * | 5/1999 | Koiwa et al. | 257/737 |
| 5,982,033 A | 11/1999 | Ohsawa et al. | |
| 6,046,499 A | 4/2000 | Yano et al. | |
| 6,111,322 A * | 8/2000 | Ando et al. | 257/778 |
| 6,222,277 B1 * | 4/2001 | Downes | 257/778 |
| 6,346,679 B1 * | 2/2002 | Nakamura | 174/260 |
| 6,395,991 B1 * | 5/2002 | Dockerty et al. | 174/252 |
| 6,426,468 B1 * | 7/2002 | Utsunomiya et al. | 174/261 |
| 6,465,743 B1 * | 10/2002 | Owens | 174/260 |

OTHER PUBLICATIONS

Abstract of Japanese Publication No. 7–050475.
Abstract of Japanese Publication No. 8–153819.
Abstract of Japanese Publication No. 8–316268.

* cited by examiner

Primary Examiner—Evan Pert
(74) Attorney, Agent, or Firm—Westerman, Hattori, Daniels & Adrian, LLP

(57) ABSTRACT

A ball grid array (BGA) electronic component package having a configuration which is capable of improving mounting efficiency as well as preventing footprints from breaking away at circuit-connecting portions of the electronic component package. The BGA package has reinforcing bumps formed in an area located outward of a predetermined area in which conventional circuit-connecting bumps are arranged. Therefore, even if a shock is applied to the BGA package at the outer or peripheral portion of the BGA package, which is most sensitive to such a shock, the shock is absorbed by the reinforcing bumps and reinforcing footprints which have no electrical connection with the circuitry of the electronic component package. Thus, the footprints formed on a mounting portion of the BGA package and those formed on the printed circuit board can be prevented from breaking away or being cracked.

4 Claims, 19 Drawing Sheets

102 BGA PACKAGE

US 6,727,718 B2

ELECTRONIC COMPONENT PACKAGE, PRINTED CIRCUIT BOARD, AND METHOD OF INSPECTING THE PRINTED CIRCUIT BOARD

This application is a Divisional Application of prior application Ser. No. 09/124,509 filed Jul. 29, 1998 now U.S. Pat. No. 6,498,307.

BACKGROUND OF THE INVENTION

1. Field of the Invention

The present invention relates to a surface-mount package, a printed circuit board having the package mounted thereon, and a method of inspecting the assembled printed circuit board and package, and more particularly, to a ball grid array package, a printed circuit board having the ball grid array package mounted thereon, and a method of inspecting the assembled printed circuit board and ball grid array package.

2. Description of the Related Art

In recent years, a ball grid array (hereinafter referred to as "BGA") package, which is a key device in high-density mounting technology, has been applied to communications devices such as a portable telephone. Moreover, the BGA package is now starting to be applied to trunk communications devices. It is expected that the BGA package continues to be applied to a wider range of applications as an LSI (Large-Scale Integration) package, to replace the large-sized QFP (Quad Flat Package) with a fine lead pitch.

FIGS. 18(A) and 18(B) schematically show external configurations of a conventional BGA package. FIG. 18(A) is a side view, while FIG. 18(B) is a bottom view. The BGA package 200 has a package body 201 in which semiconductor chips are laminated, and the package body 201 has a bottom thereof formed with a plurality of footprints (pads) 202 on which respective ball-shaped solder bumps 203 are formed on the respective footprints 202.

The BGA package 200 is mounted on a printed circuit board by soldering the solder bumps 203 onto the printed circuit board.

FIG. 19 shows the BGA package 200 mounted on the printed circuit board. The printed circuit board 204 is formed with footprints 205 thereon to which the respective solder bumps 203 are soldered. In order to solder the BGA package 200 onto the printed circuit board 204, similarly to an operation for soldering typical surface-mount components, solder paste 206 is applied onto the respective footprints 205 by a screen printing process, and then the BGA package 200 is placed on the solder paste 206, followed by melting the solder paste 206 and the solder bumps 203 by the use of a heating apparatus.

In general, if the printed circuit board 204 having the BGA package 200 mounted thereon receives a shock e.g. when it is carelessly dropped while being handled, the printed circuit board 204 is distorted, which affects solder joints on the BGA package 200. Each terminal of the BGA package 200 has a larger solder joint area than that of conventional components having leads connected thereto, so that soldered joint strength between the solder bumps 203 and the footprints 205 is relatively high. This prevents the solder bumps 203 and the footprints 205 from breaking away from each other.

However, if joint strength between the package body 201 of the BGA package 200 and the respective footprints 202 or between a substrate surface of the printed circuit board 204 and the respective footprints 205 is low, forces generated by any distortion of the printed circuit board 204 are likely to crack some of the footprints 202, 205 or cause the same to break away from the package body 201 or the printed circuit board 204. Thus, when the printed circuit board 204 receives a shock, the solder bumps 203 in the outermost rows and columns are especially prone to such cracking and breakaway since vibrations, warping, expansion, and/or contraction, have the maximum effect at the edge or peripheral portions of the printed circuit board 204.

To overcome this problem, a method is conventionally employed in which a reinforcing adhesive 207 is applied to the outermost solder bumps 203 and its vicinity, as shown in FIG. 19, so as to securely join the outermost solder bumps 203, the package body 201, and the printed circuit board 204 to each other.

However, this method increases the number of manufacturing steps, resulting in degraded working efficiency. Moreover, when the BGA package 200 is defective, it is required to discard the printed circuit board 204 together with the package 200 rather than simply replace the package 200 with a new one. This results in the waste of materials as well as an increase in manufacturing costs.

Further, since it is impossible to judge by visual inspection whether any of the solder joints on the BGA package 200 is defective, the inspection of electrical connections of the solder joints is conventionally performed at an electronic testing stage of the manufacturing process. However, the conventional electronic test cannot detect either a breakaway or a crack of the footprint 202 or 205 unless there is a disconnection in any pattern connected to the solder bumps 203.

SUMMARY OF THE INVENTION

A first object of the present invention is to provide an electronic component package and a printed circuit board which are capable of improving working efficiency in mounting the electronic component package on the printed circuit board, and at the same time preventing a breakaway of footprints formed on the electronic component package for circuit connection.

A second object of the invention is to provide a method of inspecting the printed circuit board, which is capable of detecting a defect, such as a breakaway and a crack, of footprints.

To accomplish the first object, according to a first aspect of the invention, there is provided an electronic component package of ball grid array type. The electronic component package is characterized by comprising a plurality of circuit-connecting bumps formed in a predetermined area, and at least one reinforcing bump formed in an area located outward of the predetermined area, in a manner such that the at least one reinforcing bump is connectable to at least one reinforcing pattern formed on a printed circuit board.

To accomplish the second object, according to a second aspect of the invention, there is provided a method of inspecting a printed circuit board having an electronic component package mounted thereon. This method is characterized by comprising the steps of forming a bridge circuit between reinforcing bumps formed on the electronic component package, and reinforcing footprints formed on the printed circuit board in a manner such that the reinforcing bumps are connected to the reinforcing footprints, and detecting a change in a resistance value of the bridge circuit to thereby detect a defect of the printed circuit board.

The above and other objects, features and advantages of the present invention will become apparent from the fol-

BRIEF DESCRIPTION OF THE DRAWINGS

FIGS. 2(A) and 2(B) are views showing the external configuration of the BGA package according to the first embodiment, in which:

FIG. 2(A) is a bottom view showing part of the BGA package; and

FIG. 2(B) is a sectional view taken on line X—X of FIG. 2(A);

FIGS. 3(A) and 3(B) are views showing the general configuration of the printed circuit board on which the BGA package according to the first embodiment is mounted, in which:

FIG. 3(A) is a plan view schematically showing the external configuration of the printed circuit board; and FIG. 3(B) is an enlarged view showing part of a BGA package area;

FIGS. 5(A) and 5(B) are views showing the sectional configuration of the BGA package according to the second embodiment, in which:

FIG. 5(A) is a sectional view taken on line X1—X1 of FIG. 4; and

FIG. 5(B) is a sectional view taken on line X2—X2 of FIG. 4;

FIGS. 6(A) and 6(B) are views showing a BGA package according to a third embodiment of the invention, in which:

FIG. 6(A) is a bottom view showing part of the configuration of the BGA package; and FIG. 6(B) is a sectional view taken on line X3—X3 of FIG. 6(A);

FIGS. 7(A) and 7(B) are views showing the sectional configuration of a BGA package according to a fourth embodiment of the invention, in which:

FIG. 7(A) is a bottom view showing part of the BGA package; and

FIG. 7(B) is a sectional view taken on line X4—X4 of FIG. 7(A);

FIGS. 11(A) and 11(B) are views showing the configuration of a printed circuit board according to a seventh embodiment of the invention, in which:

FIG. 11(A) is a plan view showing part of the printed circuit board; and

FIG. 11(B) is a sectional view taken on line X5—X5 of FIG. 11(A);

FIGS. 12(A) and 12(B) are views showing the configuration of a printed circuit board according to an eighth embodiment of the invention, in which:

FIG. 12(A) is a plan view showing part of the printed circuit board; and

FIG. 12(B) is a side view showing a fixing member in a mounted state;

FIGS. 13(A) and 13(B) are views showing a mounting component for use in mounting the fixing member for the printed circuit board according to the eighth embodiment, in which:

FIG. 13(A) is a view schematically showing the general construction of the mounting component; and FIG. 13(B) is an enlarged view showing part of the mounting component;

FIGS. 14(A) and 14(B) are views showing the configuration of a printed circuit board according to a ninth embodiment of the invention, in which:

FIG. 14(A) is a plan view showing part of the printed circuit board; and

FIG. 14(B) is a side view showing a fixing member in a mounted state;

FIGS. 17(A) and 17(B) are views showing the configuration of a printed circuit board according to an eleventh embodiment of the invention, in which:

FIG. 17(A) is a plan view showing part of the printed circuit board; and

FIG. 17(B) is a sectional view taken on line X6—X6 of FIG. 17(A);

FIGS. 18(A) and 18(B) are views showing the external configuration of a conventional BGA package, in which:

FIG. 18(A) is a side view showing the BGA package; and

FIG. 18(B) is a bottom view showing part of the BGA package; and

DESCRIPTION OF THE PREFERRED EMBODIMENTS

Preferred embodiments of the present invention will be described below with reference to accompanying drawings.

Figure 1:
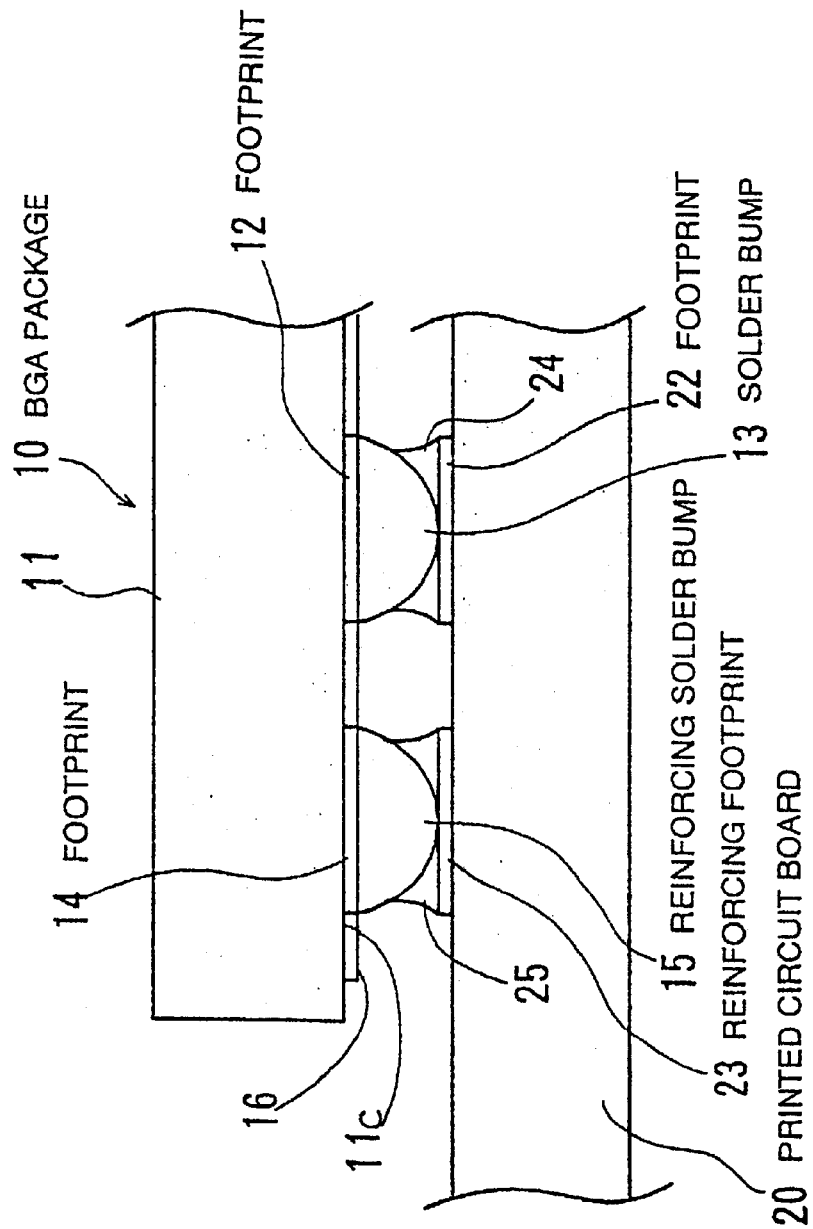
FIG. 1 is a partial sectional view of a printed circuit board, and a BGA package mounted thereon, according to a first embodiment of the present invention.
Figure 2A:
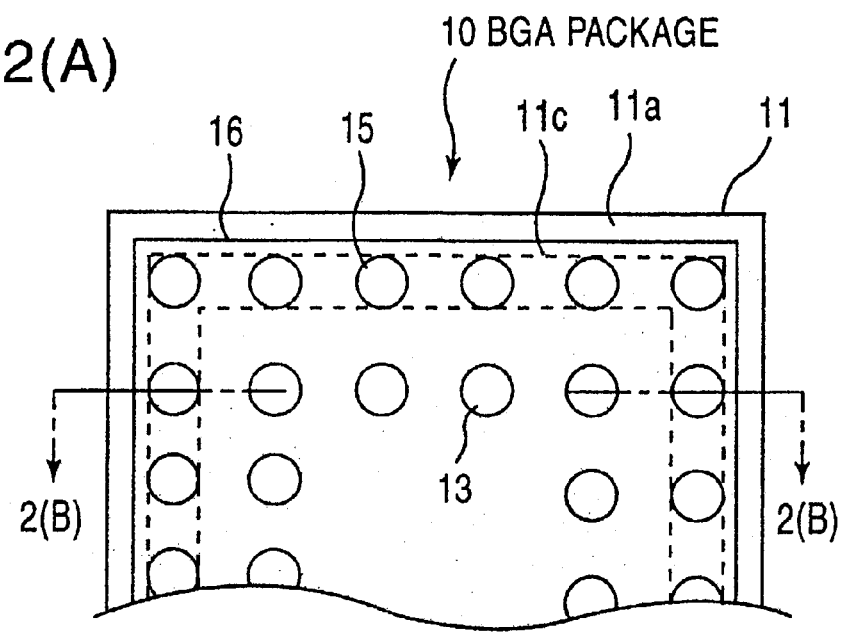
Figure 2B:
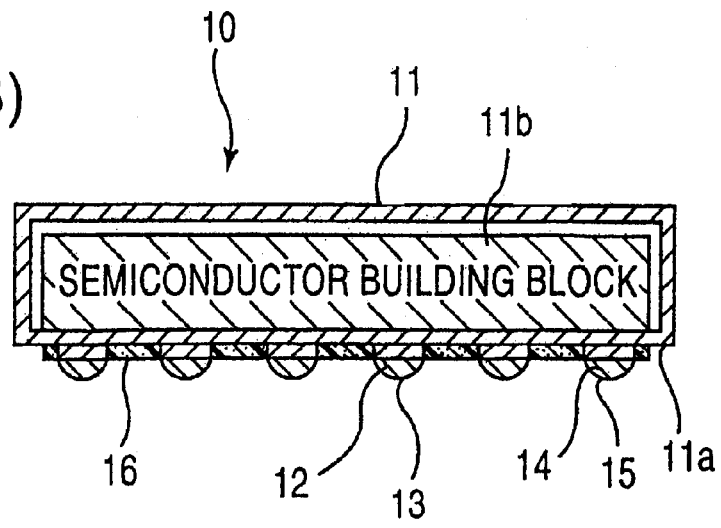
Figure 3:
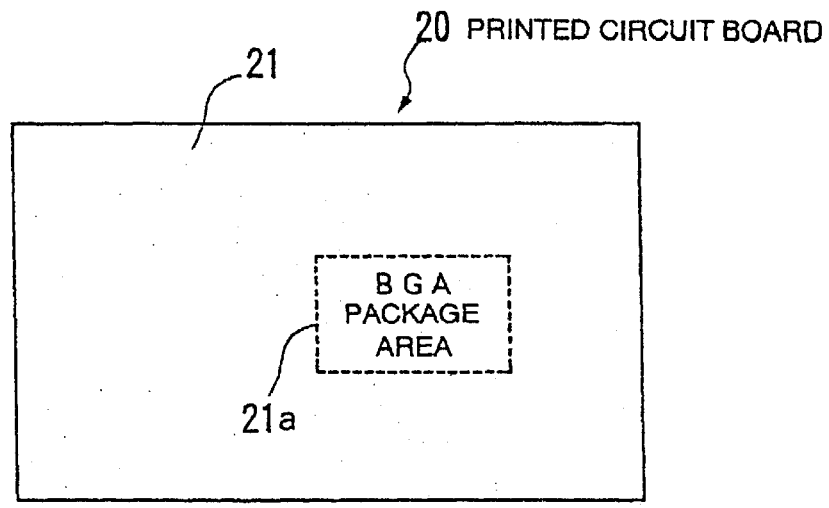
Figure 3:
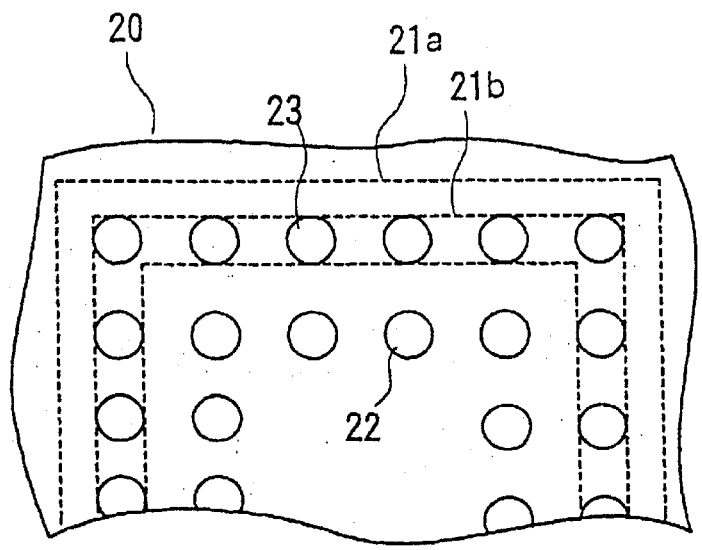

Referring first to FIGS. 1 to 3, description is made of a BGA package according to a first embodiment of the invention. FIGS. 2(A) and 2(B) show the external configuration of the BGA package. FIG. 2(A) is a partial bottom view of the BGA package, while FIG. 2(B) is a sectional view taken on line X—X of FIG. 2(A). The BGA package 10 has a package body 11 defining therein a semiconductor building block 11b in which semiconductor chips are laminated. As shown in FIG. 2(B), the package body 11 has a bottom 11a formed with a plurality of footprints (pads) 12 on which respective solder bumps are formed for connecting between terminals of the semiconductor building block 11b and the circuitry of a printed circuit board. Each of the solder bumps formed of solder is ball-shaped.

Further, a plurality of reinforcing solder bumps 15 are formed on respective footprints 14 in an area (shown by dotted lines in FIG. 2(A)) 11c enclosing a solder bump area in which the solder bumps 13 are arranged. The reinforcing solder bumps 15 have no electrical connection with the circuitry of the BGA package 10. The bottom 11a of the package body 11 has a resist 16 formed thereon. The resist 16 is printed onto the bottom 11a in a state in which the solder bumps 13 and the reinforcing solder bumps 15 are masked.

The BGA package 10 described above is mounted on the printed circuit board by soldering the respective solder bumps 13 onto the printed circuit board.

FIGS. 3(A) and 3(B) schematically show the general configuration of the printed circuit board on which the BGA package 10 according to the first embodiment is mounted. FIG. 3(A) is a plan view of the printed circuit board, while FIG. 3(B) shows part of a BGA package area of the printed circuit board on an enlarged scale. As shown in FIG. 3(A), the printed circuit board 20 has a component mounting surface 21 that includes the BGA package area 21a onto which the BGA package 10 is soldered.

In the BGA package area 21a, as shown in FIG. 3(B), there are formed a plurality of footprints (pads) 22 in a manner opposed to the respective solder bumps of the BGA package 10. Each of the solder bumps 13 is soldered to a corresponding one of the footprints 22. Further, the BGA package area 21a has an area 21b enclosing an area in which the footprints 22 are arranged, and in the area 21b, there are formed a plurality of reinforcing footprints 23 in a manner opposed to the respective reinforcing solder bumps 15. Each of the reinforcing solder bumps 15 is soldered to a corresponding one of the reinforcing footprints 23.

FIG. 1 is a sectional view showing part of the printed circuit board 20 with the BGA package 10 mounted thereon. In order to solder the BGA package 10 onto the printed circuit board 20, solder paste is applied by a screen printing method onto the footprints 22, 23 and then the BGA package 10 is placed on the printed circuit board such that each of the circuit-connecting solder bumps 13 is placed on a corresponding one of the footprints 22 and each of the reinforcing solder bumps 15 is placed on a corresponding one of the footprint 23.

Then, the printed circuit board 20 having the BGA package 10 and other circuit components, not shown in FIG. 1, mounted thereon is placed in a heating apparatus, and then the solder paste applied onto the footprints 22, 23 is melted, whereby the solder bumps 13 and the reinforcing solder bumps 15 are soldered to the footprints 22, 23, respectively, by solders 24, 25. Thus, the mounting of the BGA package 10 on the printed circuit board 20 is completed.

According to the above embodiment, the BGA package 10 mounted on the printed circuit board 20 has the reinforcing solder bumps 15 formed in the area 21b outward of the area in which are arranged the conventional solder bumps 13 for circuit connection, so that even if a shock is applied to the BGA package 10 e.g. when the printed circuit board 20 is carelessly dropped during the manufacturing work, at the outer or peripheral portion of the BGA package, which is most sensitive to such a shock, the shock is absorbed by the reinforcing solder bumps 15 and footprints 23 which have no electrical connection with the circuitry of the package 10, whereby it is possible to prevent the footprints 12 formed on the mounting-area of the BGA package 10 and the footprints 22 formed on the printed circuit board 20 from breaking away or being cracked.

Further, since extra materials such as an adhesive can be dispensed with, the number of manufacturing steps can be reduced, and at the same time, it is not required to discard the printed circuit board 20 together with the BGA package 10 even if the BGA package 10 is defective. Therefore, it is possible to enhance the working efficiency and prevent waste of materials and an increase in manufacturing costs.

Although the figures illustrate the solder bumps 13 and the reinforcing solder bumps 15 on enlarged scale for purposes of clarity of understanding, actually the solder bumps 13, 15 are smaller in comparison with the size of the BGA package 10, and the number thereof is larger than shown in the figures.

Next, a second embodiment of the present invention will be described with reference to FIG. 4 and FIGS. 5(A) and 5(B).

Figure 4:
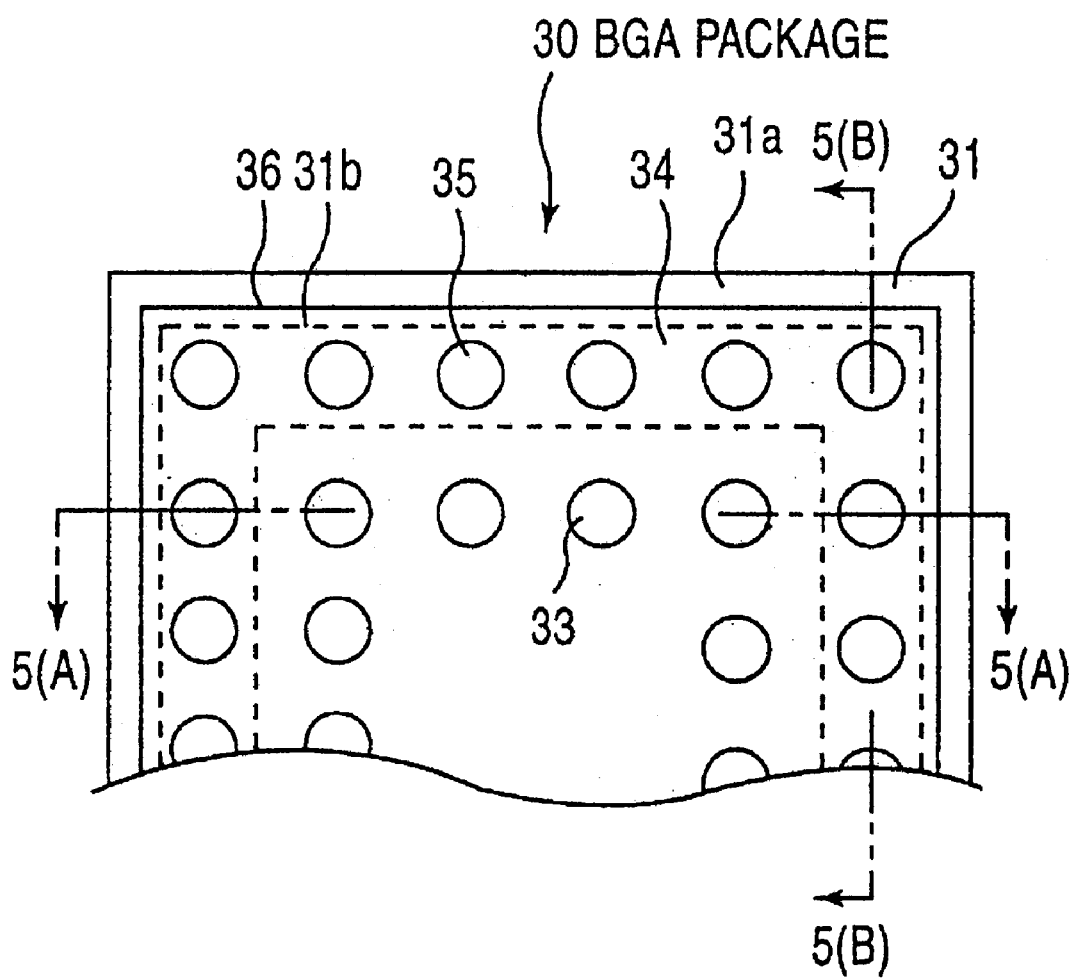
FIG. 4 is a bottom view showing the external configuration of a BGA package according to a second embodiment of the invention.
Figure 5A:
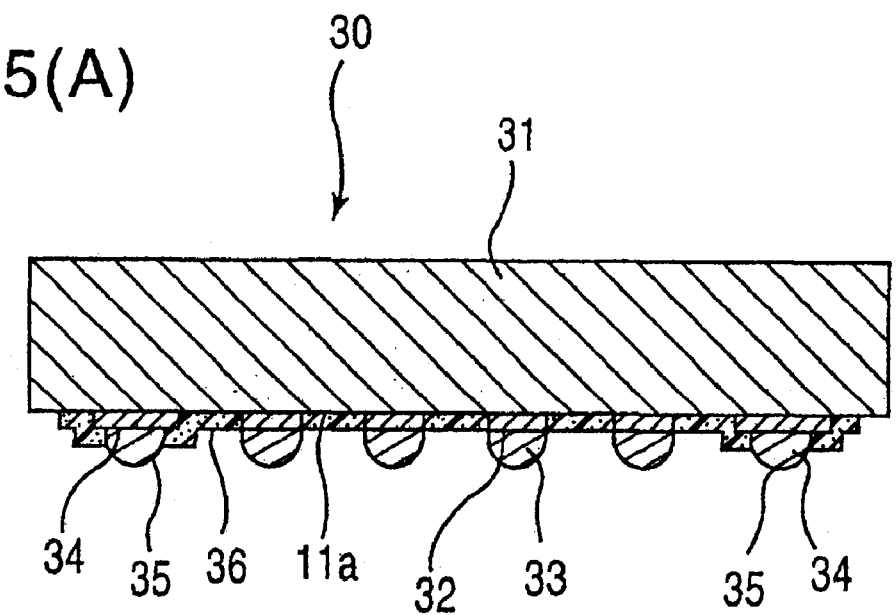
Figure 5B:
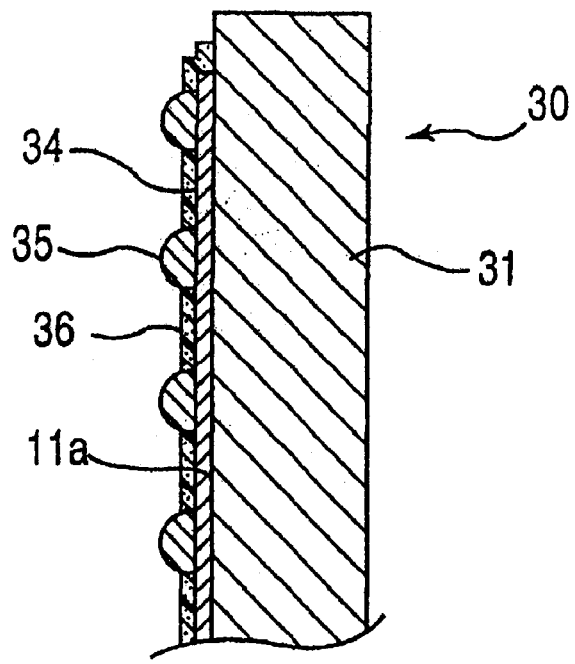

FIG. 4 is a bottom view showing the external configuration of a BGA package according to the second embodiment. FIG. 5(A) is a sectional view taken on line X1—X1 of FIG. 4, while FIG. 5(B) is a sectional view taken on line X2—X2 of the same. In FIGS. 5(A) and 5(B), illustration of the cross section of a package body 31 of the BGA package 30 is omitted. The package body 31 has a bottom 31a formed with a plurality of footprints 32 (see FIG. 5(A)) on which respective ball-shaped solder bumps 33 are formed for circuit connection.

In an area 31b (see FIG. 4) enclosing a solder bump area in which the solder bumps 33 are arranged, there are formed reinforcing solder bumps 35 on a reinforcing pattern 34. The reinforcing pattern 34 is formed such that all the reinforcing solder bumps 35 are connectable thereto. The reinforcing solder bumps 35 and the pattern 34 have no electrical connection with the circuitry of the BGA package 30. Further, the bottom 31a of the package body 31 is covered with a resist 36. The resist 36 is printed in a state in which the solder bumps 33 and the reinforcing solder bumps 35 are masked.

According to the present embodiment, since the reinforcing pattern 34 is formed in a manner connectable to all the reinforcing solder bumps 35, joint strength between the pattern 34 and the package body 31 is increased, which makes the printed circuit board with the BGA package 30 mounted thereon more resistant to a shock.

The printed circuit board has a mounting surface configured to be substantially identical to a state of the corresponding part of the BGA package 30 from which the solder bumps 33 and the reinforcing solder bumps 35 are removed. More specifically, the mounting surface of the printed circuit board is formed with one-piece pattern onto which the reinforcing solder bumps 35 are soldered. This provides the same effects as obtained by the corresponding part of the BGA package 30.

Next, a third embodiment of the invention will be described with reference to FIGS. 6(A) and 6(B).

Figure 6A:
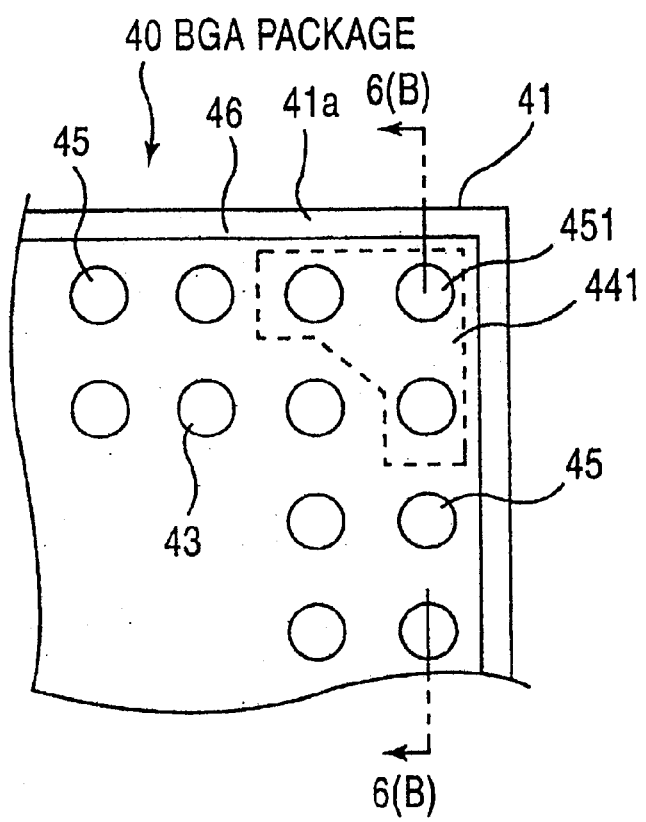
Figure 6B:
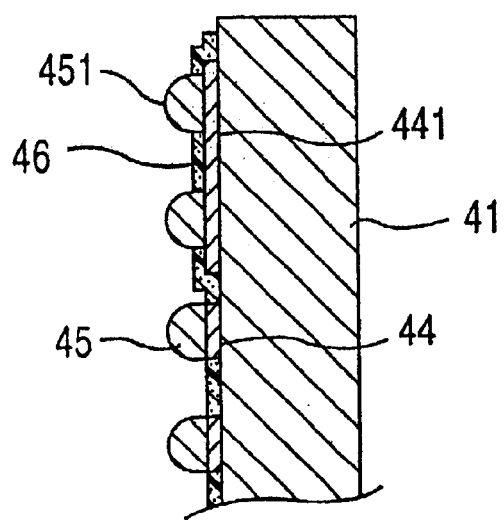

FIGS. 6(A) and 6(B) show the external configuration of a BGA package according to the third embodiment. FIG. 6(A) is a bottom view showing part of the BGA package, while FIG. 6(B) is a sectional view taken on line X3—X3 of FIG. 6(A). In the figures, illustration of the cross section of a package body 41 of the BGA package 40 is omitted. The package body 41 has a bottom 41a formed with a plurality of footprints, not shown in the figures, on which respective ball-shaped solder bumps 43 are formed for circuit connection.

In an area enclosing a solder bump area in which the solder bumps 43 are arranged, reinforcing solder bumps 45 are formed on a reinforcing pattern 44 (see FIG. 6(B)). Out of the reinforcing solder bumps 45, a plurality of reinforcing solder bumps 451 (three reinforcing solder bumps in FIG. 6(B)) are formed on a pattern 441 in a corner of the area. The pattern 441 is formed such that all the reinforcing solder bumps 451 in the corner are connectable thereto. The reinforcing solder bumps 45, 451 and the patterns 44, 441 have no electrical connection with the circuitry of the BGA package 40. Further, the bottom 41a of the package body 41 is covered with a resist 46. The resist 46 is printed in a state in which the solder bumps 43 and the reinforcing solder bumps 45, 451 are masked.

According to the present embodiment, even if the BGA package 40 receives a shock e.g. when a printed circuit board having the same mounted thereon is carelessly dropped, most of the shock is absorbed by the reinforced corners. That is, by forming a one-piece pattern 441 for the reinforcing solder bumps 451 in each corner of the BGA package, it is possible to make the strength of the BGA package higher than when footprints are formed separately for the respective reinforcing solder bumps 451. This makes it possible to more positively prevent the solder bumps from breaking away. Although FIGS. 6(A) and 6(B) show the configuration of only one corner of the package body 41, it goes without saying that the other three corners can have the same configuration.

On the other hand, the printed circuit board has a mounting surface configured to be substantially identical to a state of the corresponding part of the BGA package 40 from which the solder bumps 43 and the reinforcing solder bumps 45, 451 are removed. More specifically, the mounting surface of the printed circuit board is formed with a one-piece pattern onto which the reinforcing solder bumps 451 are soldered. This provides the same effects as obtained by the corresponding part of the BGA package 40.

Next, a fourth embodiment of the present invention will be described with reference to FIGS. 7(A) and 7(B).

Figure 7A:
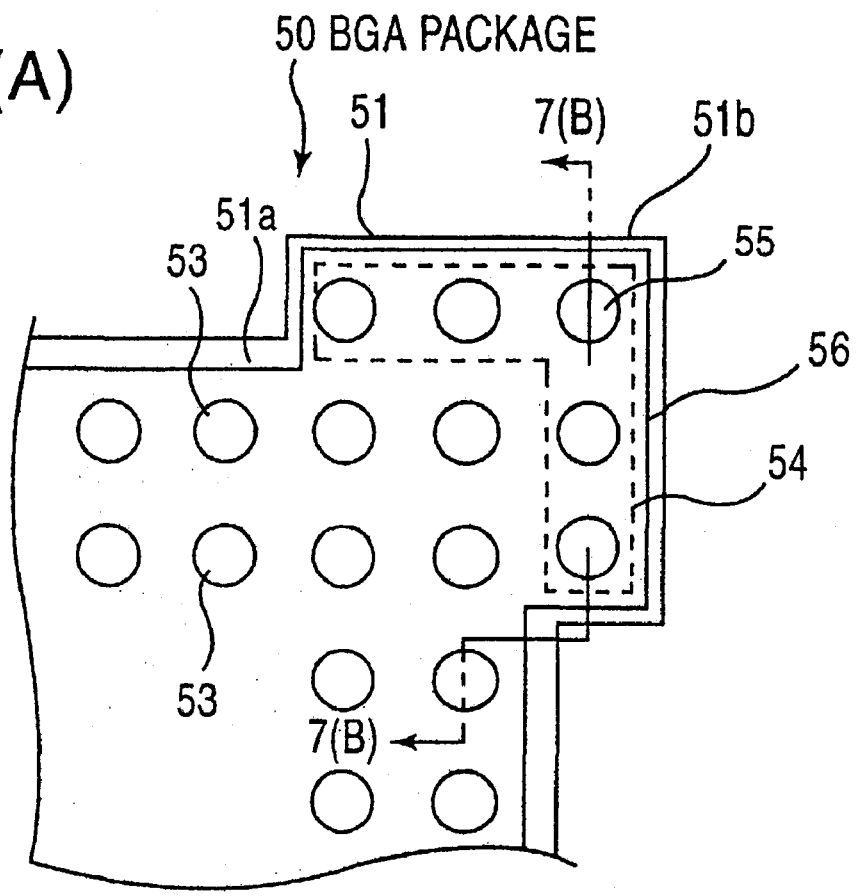
Figure 7B:
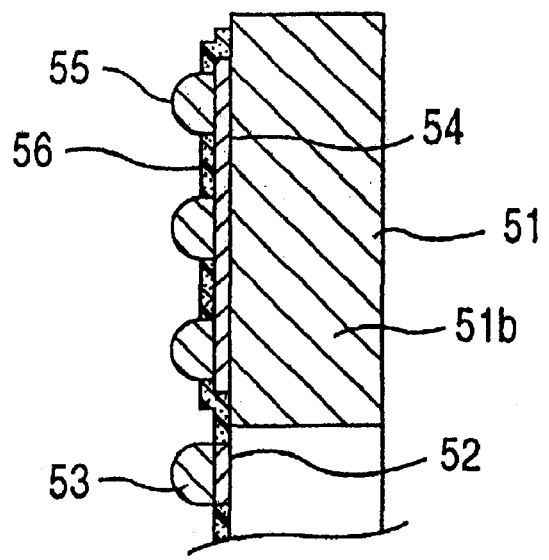

FIGS. 7(A) and 7(B) show the external configuration of a BGA package according to the fourth embodiment. FIG. 7(A) is a partial bottom view of the BGA package, while FIG. 7(B) is a sectional view taken on line X4—X4 of FIG. 7(A). In FIGS. 7(A) and 7(B), illustration of the cross section of a package body 51 of the BGA package 50 is omitted. The package body 51 has a bottom 51a formed with a plurality of footprints 52 (see FIG. 6(B)) on which respective ball-shaped solder bumps 53 are formed for circuit connection.

Further, the package body 51 has corners each formed with a protruding portion 51b having a predetermined area. The protruding portion 51b is formed with a reinforcing pattern 54, and a plurality of reinforcing solder bumps 55 (e.g. five reinforcing solder bumps 55) are formed on the pattern 54. The reinforcing pattern 54 is formed in one piece such that all the reinforcing solder bumps 55 are connectable thereto. The reinforcing solder bumps 55 and the pattern 54 have no electrical connection with the circuitry of the BGA package 50. Further, the bottom 51a (including the protruding portion 51b) of the package body 51 is covered with a resist 56. The resist 56 is printed in a state in which the solder bumps 53 and the reinforcing solder bumps 55 are masked.

According to the present embodiment constructed above, even if the BGA package 50 mounted thereon receives a shock e.g. when a printed circuit board having the same mounted thereon is carelessly dropped, most of the shock is absorbed by the protruding portions. This makes it possible to prevent the solder bumps 53 for circuit connection from breaking away from the footprints 52 and other similar inconveniences. Although FIGS. 7(A) and 7(B) show the configuration of only one corner of the package body 51, it goes without saying that the other three corners can have the same configuration.

On the other hand, the printed circuit board has a mounting surface configured such that a pattern to which the reinforcing bumps 55 are soldered is formed on an area corresponding to the protruding portion 51 of the BGA package 50. This provides the same effects as obtained by the corresponding part of the BGA package 50. In this connection, it is preferred that the pattern to which the reinforcing bumps are soldered is substantially symmetrical with the pattern 54.

Next, a fifth embodiment of the present invention will be described with reference to FIG. 8.

Figure 8:
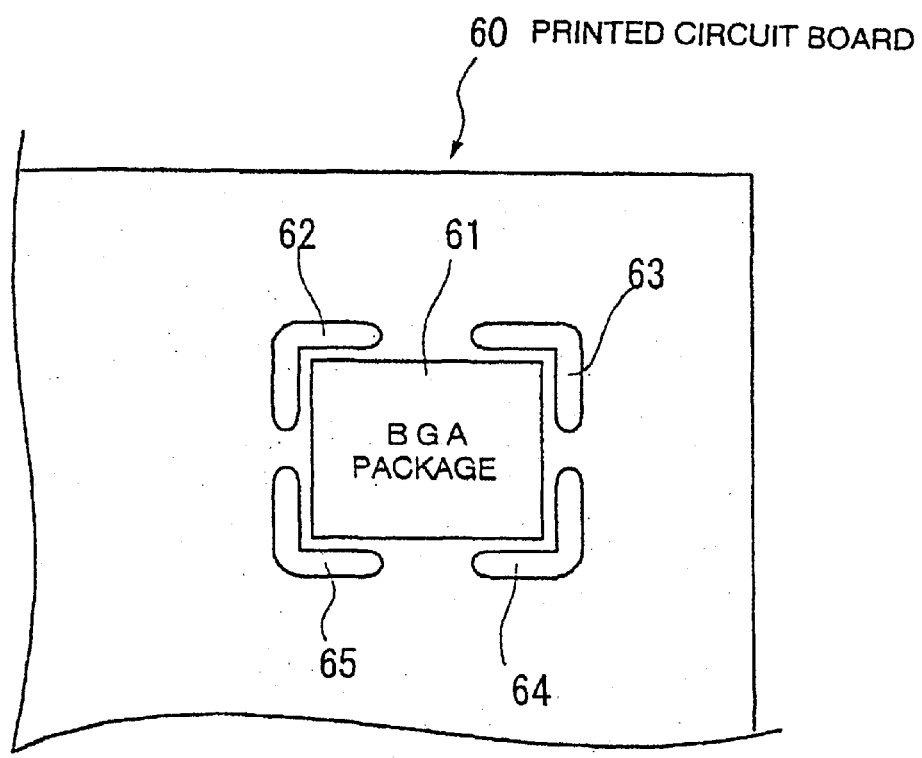
FIG. 8 is a plan view showing the configuration of a printed circuit board according to a fifth embodiment of the invention.

FIG. 8 is a plan view showing the configuration of a printed circuit board according to the fifth embodiment. The printed circuit board 60 has slots 62, 63, 64, 65 formed in the vicinity of respective corners of an area in which a BGA package 61 is mounted. Each of the slots 62, 63, 64, 65 has a width determined according to the thickness of the printed circuit board 60. For instance, when the printed circuit board 60 has a thickness of 1.6 mm, it is preferred that the slots 62, 63, 64, 65 are each formed to have a width of approximately 2 mm. When the printed circuit board 60 has a thickness of 0.8 mm, it is preferred that the slots 62, 63, 64, 65 are each formed to have a width of approximately 1 mm.

According to this embodiment, since the printed circuit board 60 is formed with the slots 62, 63, 64, 65, even if the printed circuit board 60 is dropped, a shock due to the drop is absorbed by the slots 62, 63, 64, 65, whereby distortion of the BGA package 61 caused by the shock transmitted thereto can be reduced.

Next, a sixth embodiment of the present invention will be described with reference to FIG. 9.

Figure 9:
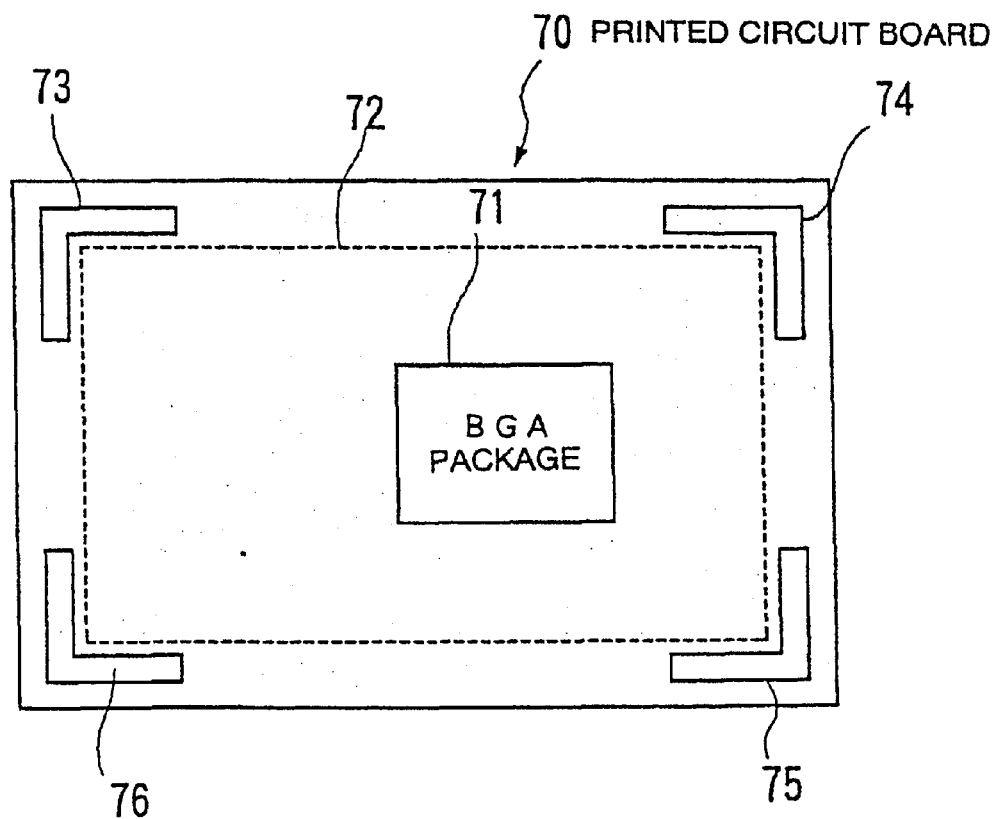
FIG. 9 is a plan view showing the configuration of a printed circuit board according to a sixth embodiment of the invention.

FIG. 9 is a plan view showing the configuration of a printed circuit board according to the sixth embodiment. The printed circuit board 70 has slots 73, 74, 75, 76 formed in the four corners thereof at respective locations outward of a component mounting area in which a BGA package 71 and other components are mounted. Each of the slots 73, 74, 75, 76 has a width determined according to the thickness of the printed circuit board 70. For instance, when the printed circuit board 70 has a thickness of 1.6 mm, it is preferred that the slots 73, 74, 75, 76 are each formed to have a width of approximately 2 mm. When the printed circuit board 70 has a thickness of 0.8 mm, it is preferred that the slots 73, 74, 75, 76 are each formed to have a width of approximately 1 mm.

According to this embodiment, since the printed circuit board 70 is formed with the slots 73, 74, 75, 76, even if the printed circuit board 70 is carelessly dropped, a shock due to the drop is absorbed by the slots 73, 74, 75, 76 in the four corners of the printed circuit board, whereby distortion of the BGA package 71 caused by the shock transmitted thereto can be reduced.

Figure 10:
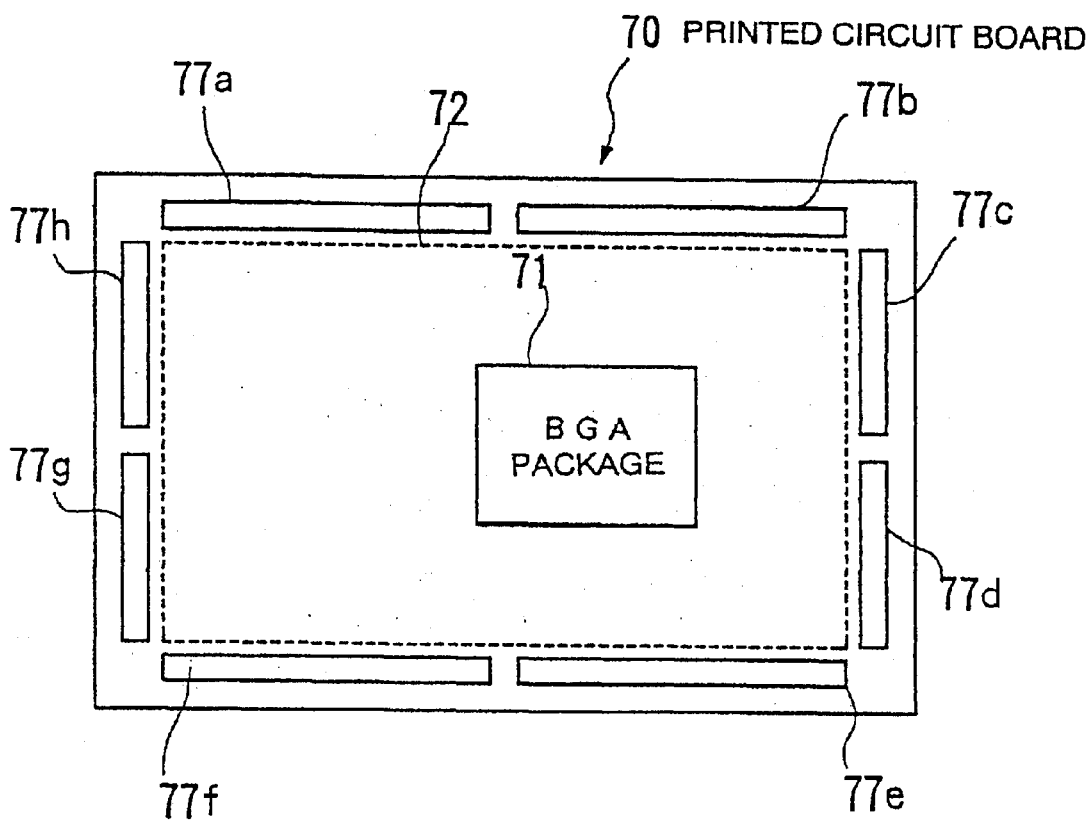
FIG. 10 is a view showing a variation of the printed circuit board according to the sixth embodiment.

Although in the sixth embodiment, the slots 73, 74, 75, 76 are formed in the four corner portions of the printed circuit board, this is not limitative, but the printed circuit board 70 may have slots 77a, 77b, 77c, 77d, 77e, 77f, 77g, 77h formed along the four sides thereof as shown in FIG. 10. This variation provides the same effect as obtained by the sixth embodiment.

Next, a seventh embodiment of the present invention will be described with reference to FIGS. 11(A) and 11(B).

Figure 11A:
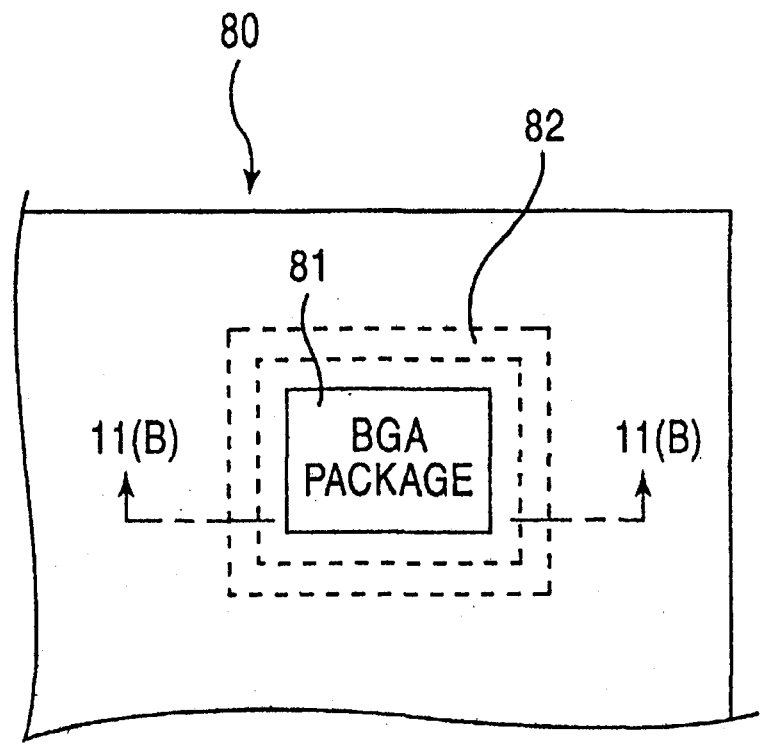
Figure 11B:
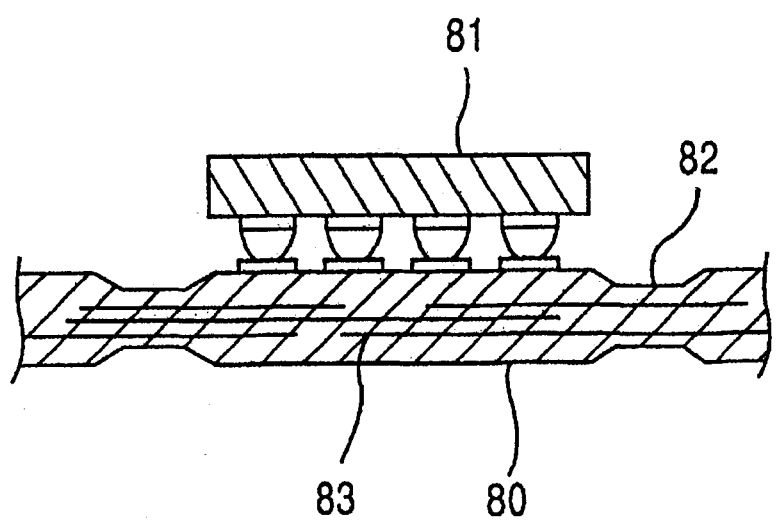

FIGS. 11(A) and 11(B) show the configuration of a printed circuit board according to the seventh embodiment. FIG. 11(A) is a plan view showing part of the printed circuit board, while FIG. 11(B) is a sectional view taken on line X5—X5 of FIG. 11(A). The printed circuit board 80 has a thin portion 82 grooved in a manner enclosing a BGA package area in which a BGA package 81 is mounted. As shown in FIG. 11(B), the thin portion 82 is formed by grooving a front side (top) and a reverse side (bottom) of the printed circuit board 80 at opposite locations. The thin portion 82 has a thickness which is determined according to the thickness of the other part of the printed circuit board 80. For instance, when the other part of the printed circuit board 80 has a thickness of 1.6 mm, it is preferred that the thin portion 82 is formed to have a thickness of approximately 0.8 mm.

It should be noted that wiring 83 extending across the thin portion 82 can be arranged in an inner layer of the printed circuit board 80.

According to this embodiment, since the printed circuit board 80 is formed with the thin portion 82, even if the printed circuit board 80 is carelessly dropped, a shock due to the drop is absorbed by the thin portion 82, whereby distortion of the soldered portions of the BGA package 81 caused by the shock transmitted thereto can be reduced.

Next, an eighth embodiment of the present invention will be described with reference to FIGS. 12(A) and 12(B).

Figure 12A:
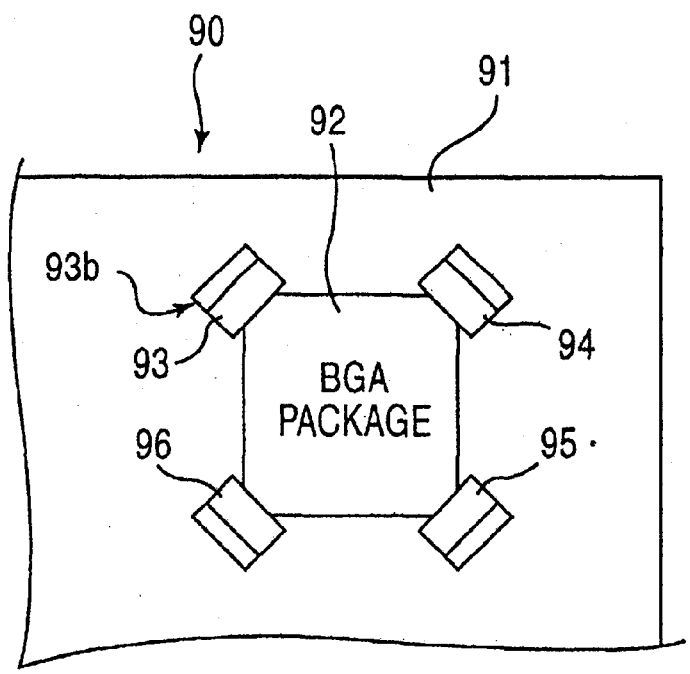
Figure 12B:
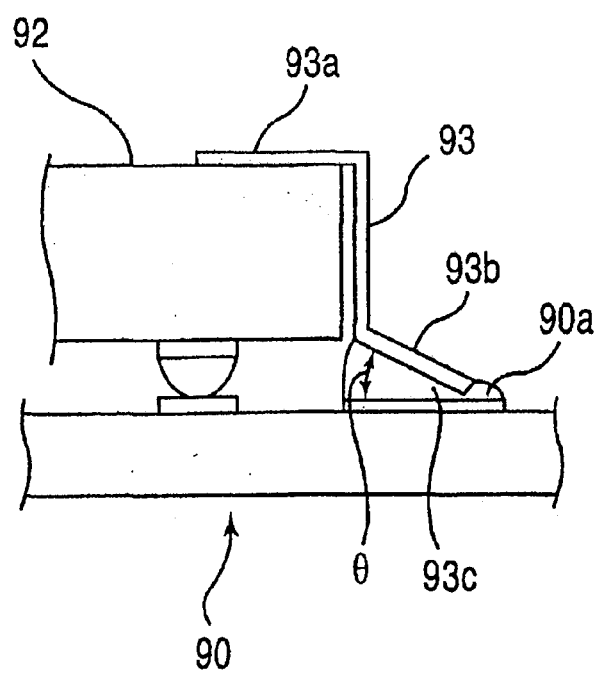

FIGS. 12(A) and 12(B) show the configuration of a printed circuit board according to the eighth embodiment. FIG. 12(A) is a plan view showing part of the printed circuit board, while FIG. 12(B) is a side view showing a fixing member in a state mounted on a BGA package and the printed circuit board. The printed circuit board 90 of the eighth embodiment has a component mounting surface 91 onto which the BGA package 92 is mounted. The BGA package 92 is mounted on the printed circuit board 90 with four corners thereof fixed to the printed circuit board by the respective fixing members 93, 94, 95, 96. FIG. 12(B) shows the fixing member 93 in a mounted state. The fixing member 93 is a chip component, such as a resistor or a capacitor, which can be automatically mounted. The fixing member 93 is comprised of a presser portion 93a for pressing the BGA package 92 downward and a soldered portion 93b soldered to the surface of the printed circuit board 90. The soldered portion 93b is formed to have a suitable angle θ with respect to the surface of the printed circuit board.

Similarly to the BGA package 92, the fixing member 93 is mounted on a footprint 90a having solder paste 93c applied thereto, by an automatic mounting apparatus. Then, the solder paste 93c is melted when the BGA package 92, the printed circuit board, and the fixing member 93 are within a heating apparatus to thereby secure the fixing member 93 onto the printed circuit board. During the process, the fixing member 93, which has the soldered portion 93b formed to have the suitable angle θ with respect to the surface of the printed circuit board, can be flexibly set according to the height of the BGA package 92.

The other fixing members 94, 95, 96 each have substantially the same construction as that of the fixing member 93 described above in detail. Hence, description of the fixing members 94, 95, 96 is omitted.

According to the above embodiment, since the four corners of the BGA package 92 are secured to the printed circuit board 90 by the fixing members 93, 94, 95, 96, even if the printed circuit board 90 is carelessly dropped, a shock transmitted to soldered portions of the BGA package 92 can be reduced.

It is noted that although in the above description, the fixing member 93 is formed by a chip component such as a resistor or a capacitor, this is not limitative, but any solderable component, such as a molded/deposited component, a metal component, and a ceramic component, may be employed as a fixing member 93.

Figure 13:
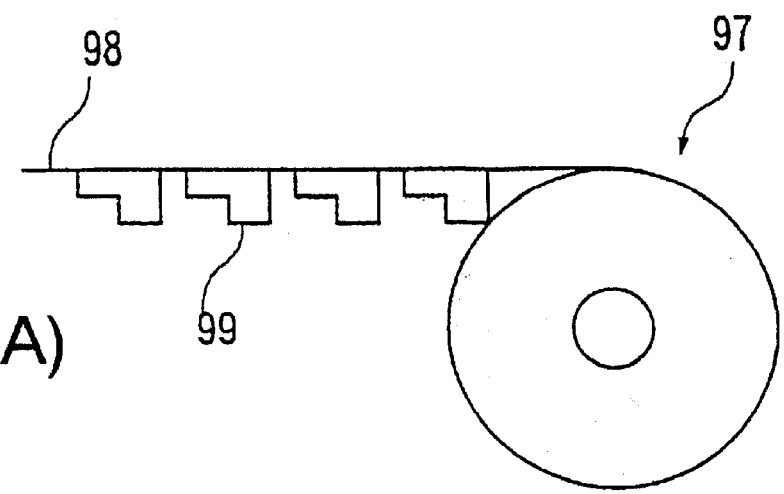
Figure 13:
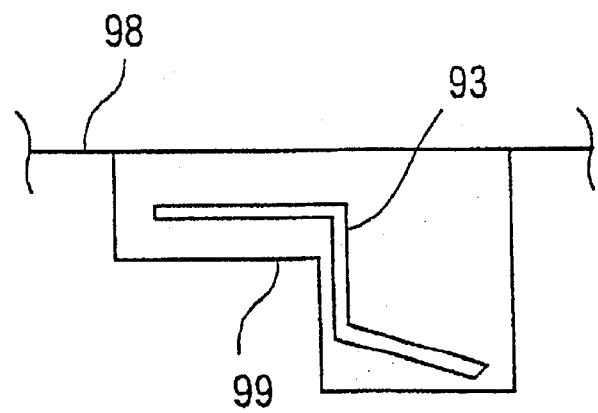

FIGS. 13(A) and 13(B) show the construction of a mounting component for mounting the fixing member 93 according to the eighth embodiment or the like. FIG. 13(A) is a view schematically showing the whole construction of the mounting component, while FIG. 13(B) is an enlarged view showing part of the same. The mounting component 97 is a roll of a tape 98 wound around a reel. The tape 98 has a plurality of recesses 99 formed by press molding at equally-spaced intervals. Each of the recesses 99 contains one electronic component, such as a fixing member 93.

The mounting component 97 is installed in the automatic mounting apparatus, and the fixing members 93 contained in the respective recesses 99 are taken out one by one by a robot hand, and placed on the printed circuit board 90.

Next, a ninth embodiment of the present invention will be described with reference to FIGS. 14(A) and 14(B).

Figure 14A:
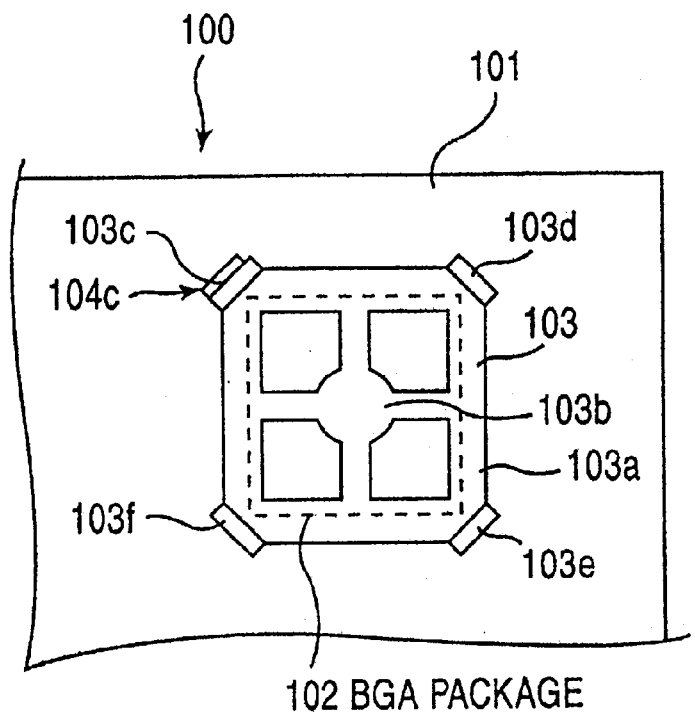
Figure 14B:
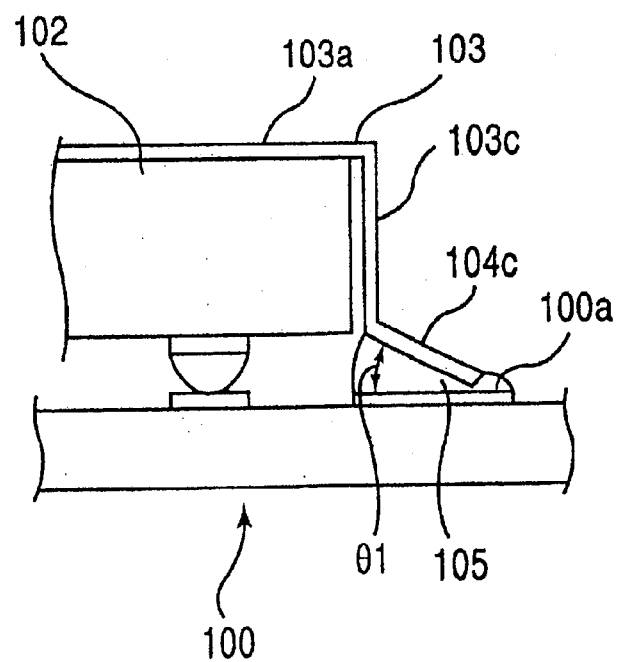

FIGS. 14(A) and 14(B) show a printed circuit board according to the ninth embodiment. FIG. 14(A) is a plan view showing part of the printed circuit board, while FIG. 14(B) is a side view showing a fixing member in a state mounted on a BGA package and the printed circuit board. The printed circuit board 100 has a component mounting surface 101 on which the BGA package 102 is mounted. The BGA package 102 is secured to the component mounting surface 101 in a state pressed downward by a fixing member 103. The fixing member 103 is comprised of a frame portion 103a for retaining the BGA package 102 at the edges thereof, a presser portion 103b for pressing the central portion of the BGA package 102 downward, and terminal portions 103c, 103d, 103e, 103f formed at the four corners. The fixing member 103 is formed in one piece by a solderable member, such as a molded/deposited member, a metal member, or a ceramic member.

FIG. 14(B) shows the terminal portion 103c in a mounted state. The terminal portion 103c has an end thereof formed as a soldered portion 104c formed to have a suitable angle θ1 with respect to the surface of the printed circuit board 100.

The fixing member 103 constructed as above is carried in a tray and automatically mounted by a mounting apparatus for use in mounting deformed members. More specifically, similarly to the BGA package 102, the fixing member 103 is placed on a footprint 100a having solder paste 105 applied thereto, by the automatic mounting apparatus, and then the solder paste 105 is melted when the BGA package 102, the printed circuit board and the fixing member are within a heating apparatus to thereby secure the fixing member 103 onto the printed circuit board. During the mounting process, the fixing member 103, which has the soldered portion 104c formed to have the suitable angle θ1 with respect to the surface of the printed circuit board can be flexibly set according to the height of the BGA package 102.

The other terminal portions 103d, 103e, 103f each have substantially the same construction as that of the terminal portion 103c described above in detail. Hence, description of the terminal portions 103d, 103e, 103f is omitted.

According to the above embodiment, since the BGA package 102 is secured to the printed circuit board 100 by the fixing members 103 constructed as above, even if the printed circuit board 100 is carelessly dropped, a shock transmitted to soldered portions of the BGA package 100 can be reduced.

Next, a tenth embodiment of the present invention will be described with reference to FIGS. 15 and 16.

Figure 15:
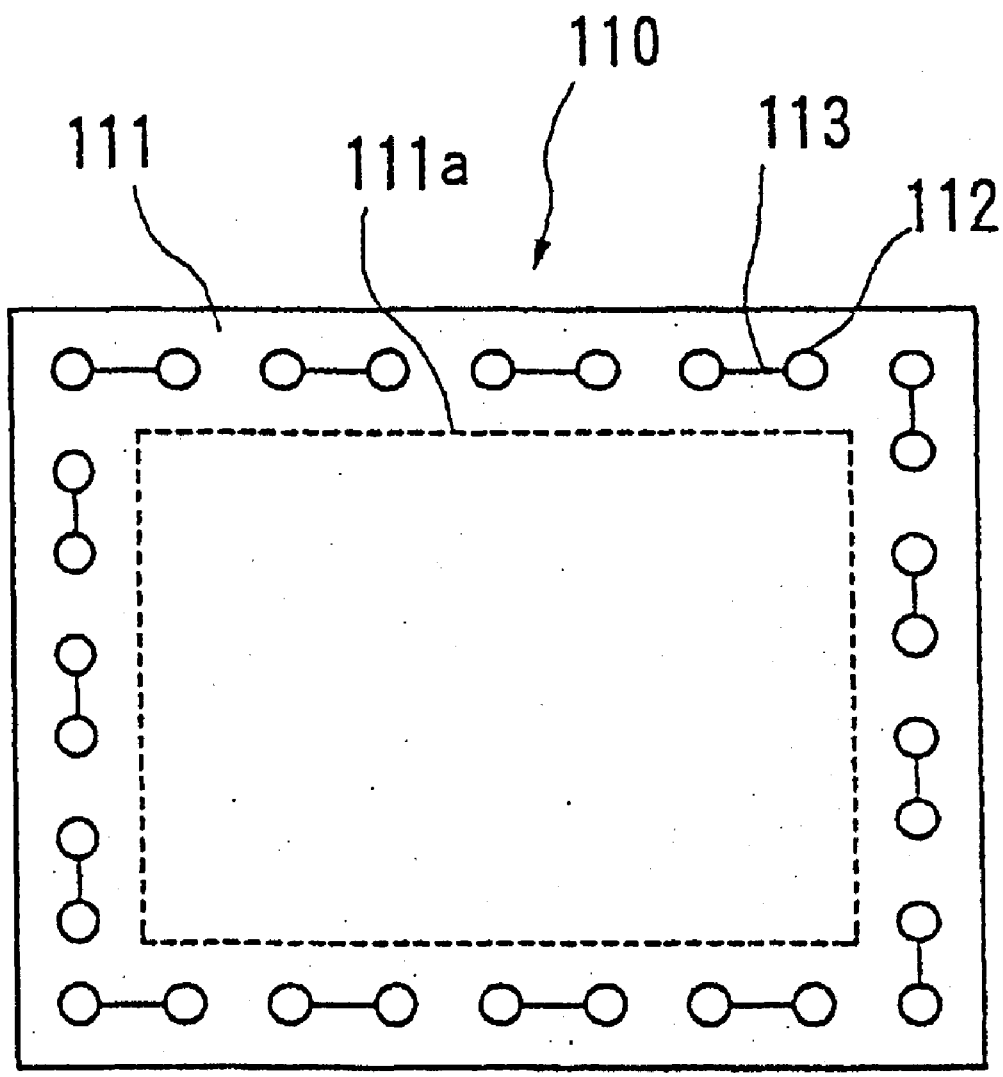
FIG. 15 is a bottom view showing a mounting surface of a BGA package according to a tenth embodiment of the invention.

FIG. 15 is a bottom view showing the configuration of a mounting surface of a BGA package according to the tenth embodiment. The mounting surface 111 of the BGA package 110 is formed with a large number of reinforcing solder bumps 112 at equally-spaced intervals along peripheral portions thereof enclosing a solder bump area 11a for solder bumps for circuit connection. The reinforcing solder bumps 112 are formed on respective footprints, not shown in FIG. 15, such that they are connected in pairs by connecting patterns 113.

Figure 16:
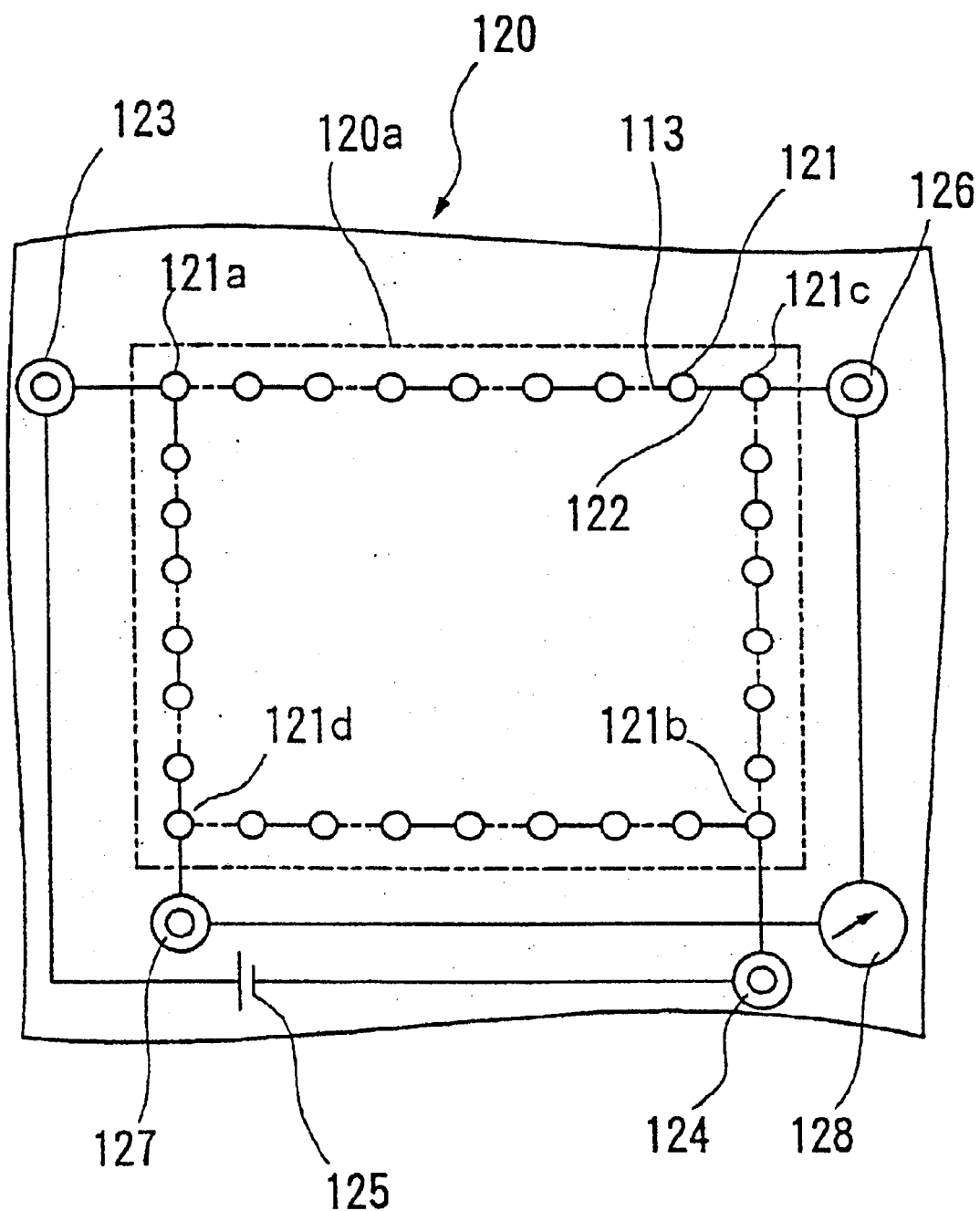
FIG. 16 is a plan view showing the configuration of a printed circuit board according to the tenth embodiment.

FIG. 16 is a plan view showing the configuration of a printed circuit board according to the tenth embodiment. The printed circuit board 120 has an area 120a in which the BGA package 110 is mounted, and footprints 121 to which the respective reinforcing solder bumps 112 on the BGA package 110 are connected are formed at locations corresponding to the reinforcing solder bumps. Further, out of the footprints 121, one diagonally opposite pair of footprints 121a, 121b are connected to respective through holes 123, 124 formed through the printed circuit board 120, while the other diagonally opposite pair of footprints 121c, 121d are connected to respective through holes 126, 127.

In order to inspect the printed circuit board 120 having the BGA package 110 mounted thereon, a so-called bridge circuit is formed by connecting a power supply 125 between the through holes 123, 124, and at the same time connecting a galvanometer 128 between the through holes 126, 127.

When the BGA package 110 has no defective soldered portions, the value of the galvanometer 128 indicates an equilibrium value. On the other hand, when a shock due to a drop of the printed circuit board 120 have caused a breakaway or a crack of the footprints or the connecting patterns 113 for the reinforcing solder bumps 112 on the BGA package 110, or the footprints 121 or a pattern 122 on the printed circuit board 120, the defective portion undergoes a change in the resistance value, which causes a change in the value of the galvanometer 128. From this, it is possible to detect a defect which cannot be visually detected.

Next, an eleventh embodiment will be described with reference to FIGS. 17(A) and 17(B).

Figure 17A:
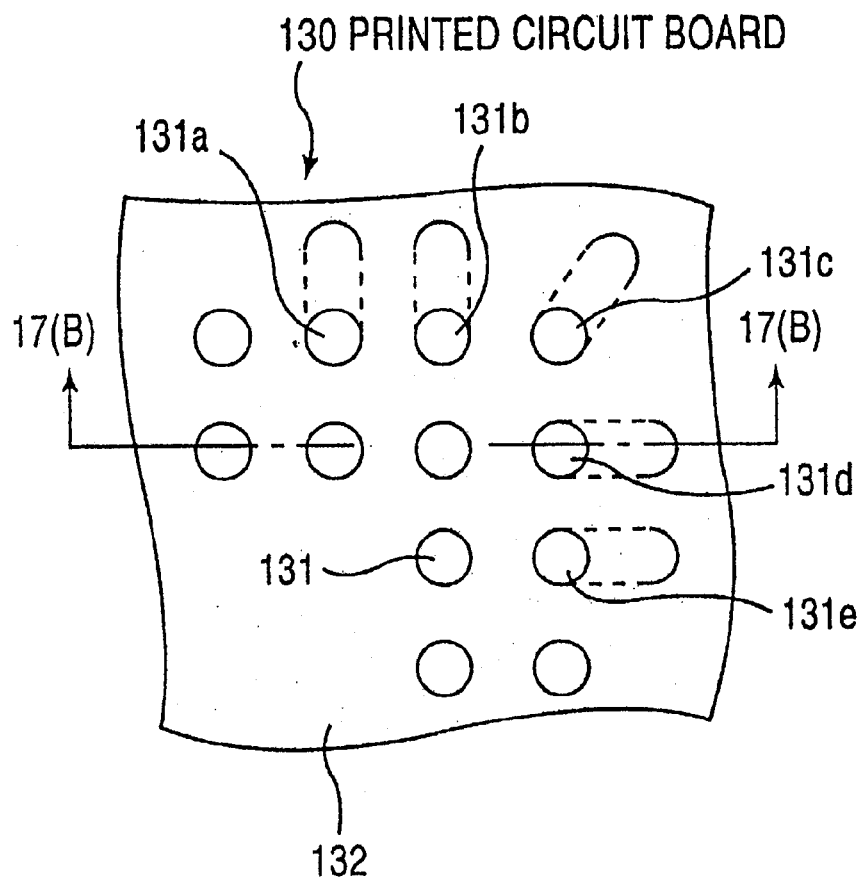
Figure 17B:
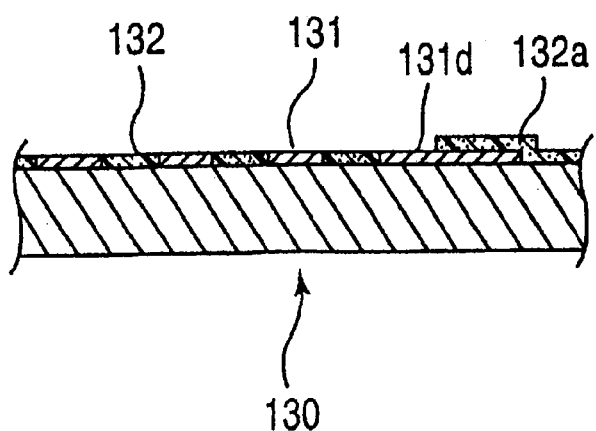
Figure 18:
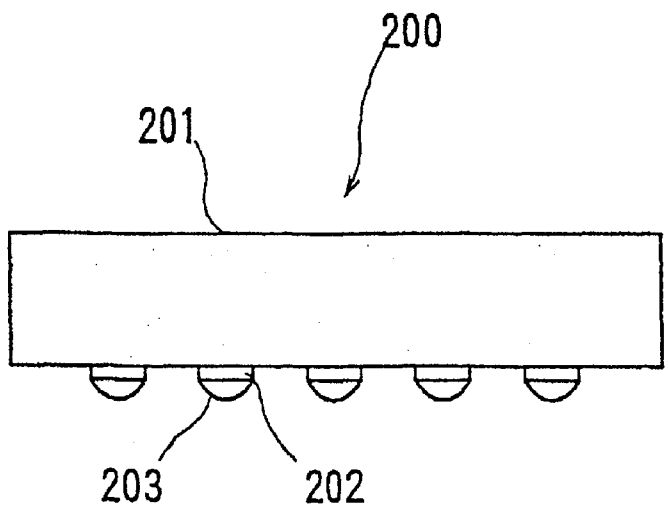
Figure 18:
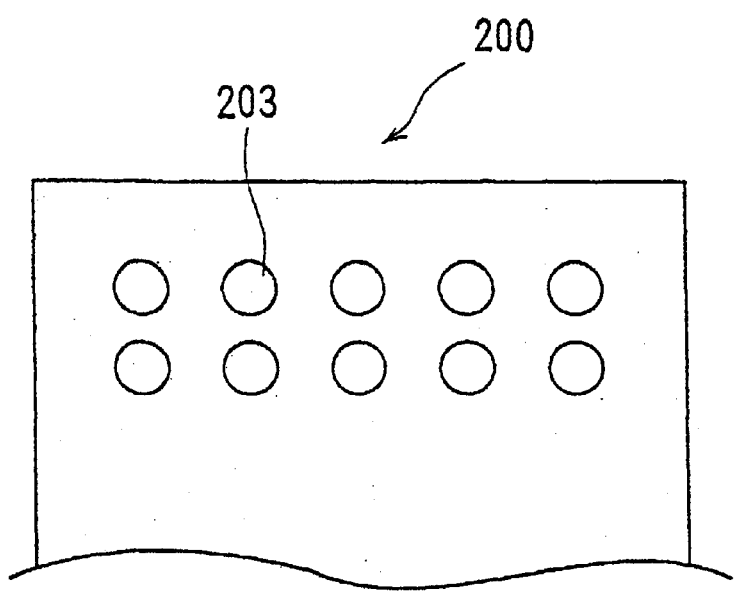
Figure 19:
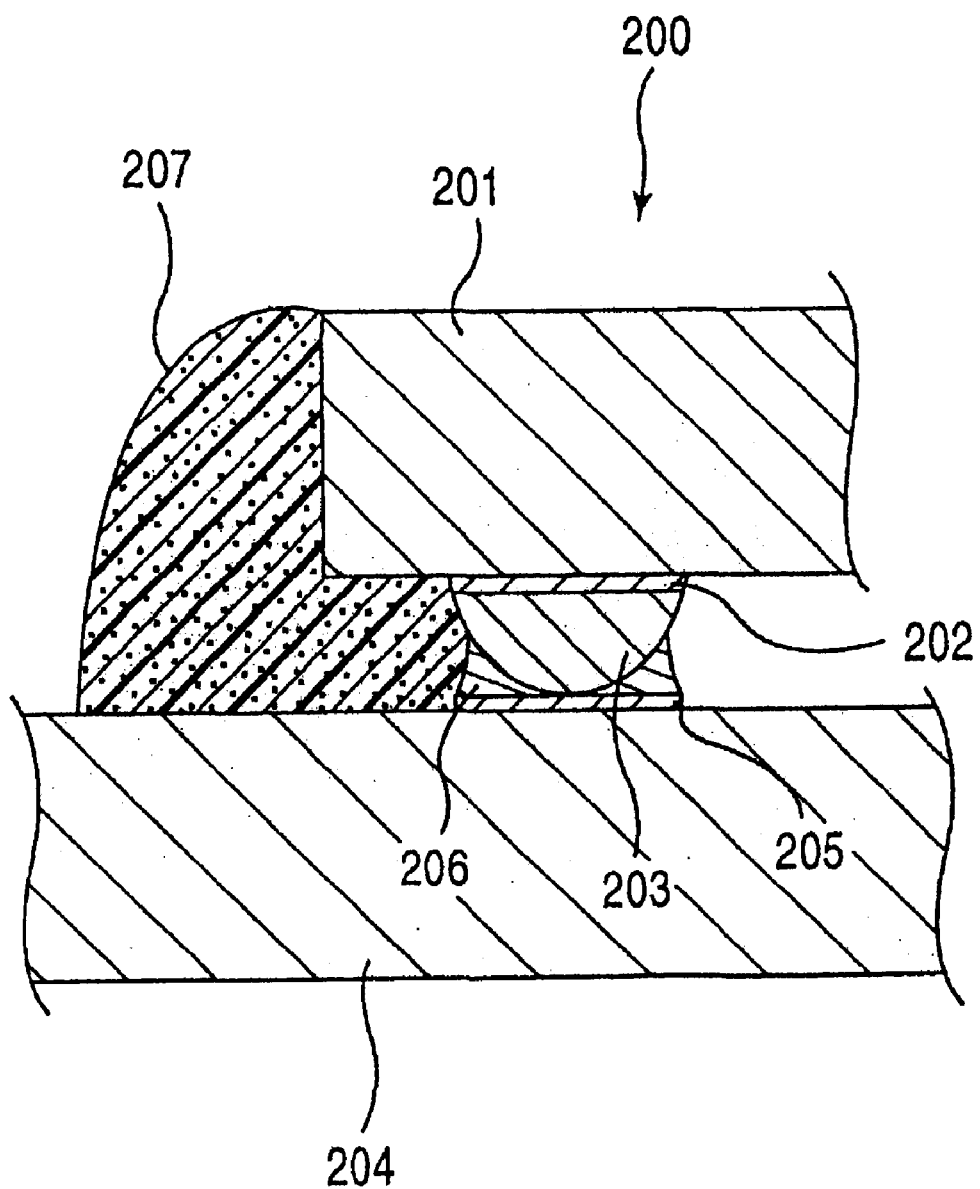
FIG. 19 is a view showing the conventional BGA package mounted on a conventional printed circuit board.

FIGS. 17(A) and 17(B) show the configuration of a printed circuit board according to the eleventh embodiment. FIG. 17(A) is a plan view showing part of the printed circuit board, while FIG. 17(B) is a view taken on line X6—X6 of FIG. 17(A). A BGA package area of the printed circuit board 130 in which a BGA package is mounted is formed with footprints 131 to which are connected solder bumps for circuit connection. The footprints 131 are formed at locations opposed to the respective solder bumps. The top of the printed circuit board 130 except the portions at which the footprints 131 are formed is covered with a resist 132.

Further, out of the footprints 131, footprints 131a, 131b, 131c, 131d, 131e arranged in an outer corner portion of the printed circuit board 130 are each formed to have a larger size than the other footprints 131. However, each of the footprints 131a, 131b, 131c, 131d, 131e has only a portion thereof exposed for connection with the corresponding solder bump on the BGA package, and the other portion thereof covered with a portion 132a of the resist 132.

This configuration makes it possible to increase joint strength between the corner footprints 131a, 131b, 131c, 131d, 131e, which are sensitive to a shock from outside, and the printed circuit board 130, thereby preventing the footprints 131a, 131b, 131c, 131d, 131e from breaking away from the printed circuit board 130 when a shock is applied to the printed circuit board 130 e.g. due to a drop of the same.

Further, it is preferred that the BGA package mounted on the printed circuit board 130 is formed with footprints for solder bumps thereof, which are configured similarly to the above footprints of the printed circuit board 130.

As described above, according to the present invention, an area on a BGA package located outward of a circuit-connecting solder bump area is formed with reinforcing solder bumps which can be connected to a reinforcing pattern(s) formed on a printed circuit board, so that once the reinforcing solder bumps are connected to the reinforcing pattern(s) e.g. by soldering, even if a shock is applied to the package e.g. when the printed circuit board having the package mounted thereon is carelessly dropped, the shock applied to the outer or peripheral portion of the package, which is most sensitive to such a shock, is absorbed by the reinforcing solder bumps and the reinforcing pattern(s) which have no electrical connection with the circuits. Therefore, the invention makes it possible to prevent a breakaway or a crack of the footprints and the like formed at the circuit-connecting portions of the electronic component package.

Moreover, since extra materials such as an adhesive can be dispensed with, it is possible to reduce the number of manufacturing steps. Further, even if the electronic component package becomes defective, it is not required to discard the printed circuit board together with the package. This helps to prevent waste of materials as well as an increase in manufacturing costs.

Furthermore, the present invention provides the method of checking a printed circuit board having an electronic component package of ball grid array type mounted thereon, in which a bridge circuit is formed between the reinforcing solder bumps formed on the electronic component package and the reinforcing footprints formed on the printed circuit board, and then by detecting a change in the resistance value of the bridge circuit, a defective state of the printed circuit board is detected. This makes it possible to detect a defect which cannot be visually detected.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An electronic component package of ball grid array type, comprising: a plurality of circuit-connecting bumps formed in a predetermined area, and at least one reinforcing bump formed in an area located outward of said predetermined area, in a manner such that said at least one reinforcing bump is connectable to at least one reinforcing pattern formed on a printed circuit board, wherein a plurality of said reinforcing bumps are formed on a single pattern.

2. An electronic component package according to claim 1, wherein said at least one reinforcing bump is formed in at least one corner of said electronic component package.

3. An electronic component package according to claim 1, wherein said at least one reinforcing bump is formed along at least one side of said electronic component package.

4. An electronic component package according to claim 1, including a body having a corner, an area for said at least one reinforcing bump is formed in a manner of projecting from an end face of said corner.

* * * * *

UNITED STATES PATENT AND TRADEMARK OFFICE
CERTIFICATE OF CORRECTION

PATENT NO.    : 6,727,718 B2
DATED         : April 27, 2004
INVENTOR(S)   : Ichihara et al.

It is certified that error appears in the above-identified patent and that said Letters Patent is hereby corrected as shown below:

<u>Title page,</u>
Item [73], Assignee, change the name "Fujistu Limited" to be -- Fujitsu Limited --.

Signed and Sealed this

Twenty-seventh Day of September, 2005

JON W. DUDAS
*Director of the United States Patent and Trademark Office*